(12) United States Patent
Lin et al.

(10) Patent No.: US 11,515,347 B2
(45) Date of Patent: Nov. 29, 2022

(54) DAM OF IMAGE SENSOR MODULE HAVING SAWTOOTH PATTERN AND INCLINED SURFACE ON ITS INNER WALL AND METHOD OF MAKING SAME

(71) Applicants: Wei-Feng Lin, Hsinchu (TW); En-Chi Li, Hsinchu (TW); Chi-Chih Huang, Taoyuan (TW)

(72) Inventors: Wei-Feng Lin, Hsinchu (TW); En-Chi Li, Hsinchu (TW); Chi-Chih Huang, Taoyuan (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 130 days.

(21) Appl. No.: 16/747,130

(22) Filed: Jan. 20, 2020

(65) Prior Publication Data

US 2021/0225914 A1    Jul. 22, 2021

(51) Int. Cl.
*H01L 27/146* (2006.01)

(52) U.S. Cl.
CPC .. *H01L 27/14623* (2013.01); *H01L 27/14618* (2013.01); *H01L 27/14632* (2013.01); *H01L 27/14636* (2013.01); *H01L 27/14685* (2013.01); *H01L 27/14687* (2013.01)

(58) Field of Classification Search
CPC ......... H01L 27/14623; H01L 27/14618; H01L 27/14685; H01L 27/14632; H01L 27/14687; H01L 27/14636
See application file for complete search history.

(56) References Cited

U.S. PATENT DOCUMENTS

| | | | |
|---|---|---|---|
| 7,569,424 B2 * | 8/2009 | Nystrom | B81C 1/00269 438/116 |
| 7,651,881 B2 | 1/2010 | Takasaki et al. | |
| 8,279,336 B2 * | 10/2012 | Tsuduki | H01L 27/14683 348/374 |
| 10,312,276 B2 | 6/2019 | Chien et al. | |
| 2006/0023108 A1 * | 2/2006 | Watanabe | H01L 27/14627 348/335 |
| 2009/0224344 A1 * | 9/2009 | Huang | H01L 27/14618 257/432 |
| 2009/0267170 A1 * | 10/2009 | Chien | H01L 27/14683 257/434 |
| 2016/0260761 A1 * | 9/2016 | Jun | H01L 27/14618 |
| 2018/0031798 A1 * | 2/2018 | Choi | G02B 7/021 |
| 2019/0027531 A1 | 1/2019 | Lin et al. | |
| 2021/0183928 A1 * | 6/2021 | Hoshi | H01L 27/14603 |

* cited by examiner

*Primary Examiner* — Jonathan Han

(57) ABSTRACT

An image sensor module comprises an image sensor having a light sensing area, a cover glass for covering the light sensing area, a dam between the image sensor and the cover glass, which surrounds the light sensing area, and has an outer wall and an inner wall, where a cross-section of the inner wall parallel to the surface of the light sensing area of the image sensor forms a sawtooth pattern and/or, where a cross-section of the inner wall orthogonal to the surface of the light sensing area of the image sensor forms an inclined surface.

9 Claims, 6 Drawing Sheets

DAM OF IMAGE SENSOR MODULE HAVING SAWTOOTH PATTERN AND INCLINED SURFACE ON ITS INNER WALL AND METHOD OF MAKING SAME

FIELD OF THE INVENTION

This invention relates to an image sensor module, and more specifically relates to a dam of an image sensor module having sawtooth pattern and inclined surface on its inner wall.

BACKGROUND OF THE INVENTION

Recently, cameras are mounted on smart phones, automobiles, medical devices, and so on. With the development of technology, the resolution of the camera increases, while the size of the camera reduces significantly. The cameras are manufactured by using typically, but not limited to, complementary metal oxide semiconductor (CMOS) image sensors. Incident light transmitted through the lens is focused on the image sensor forming the image of the object.

The camera comprises an image sensor module. In the image sensor module, the image sensor is typically enclosed or surrounded by a dam, which functions as a spacer between the image sensor and the cover glass in the image sensor module. Some of incident light may be reflected by inner wall of the dam causing unwanted flare on the image detected by the image sensor.

Accordingly, image sensor modules that reduce or eliminate the flare on the detected image are demanded.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
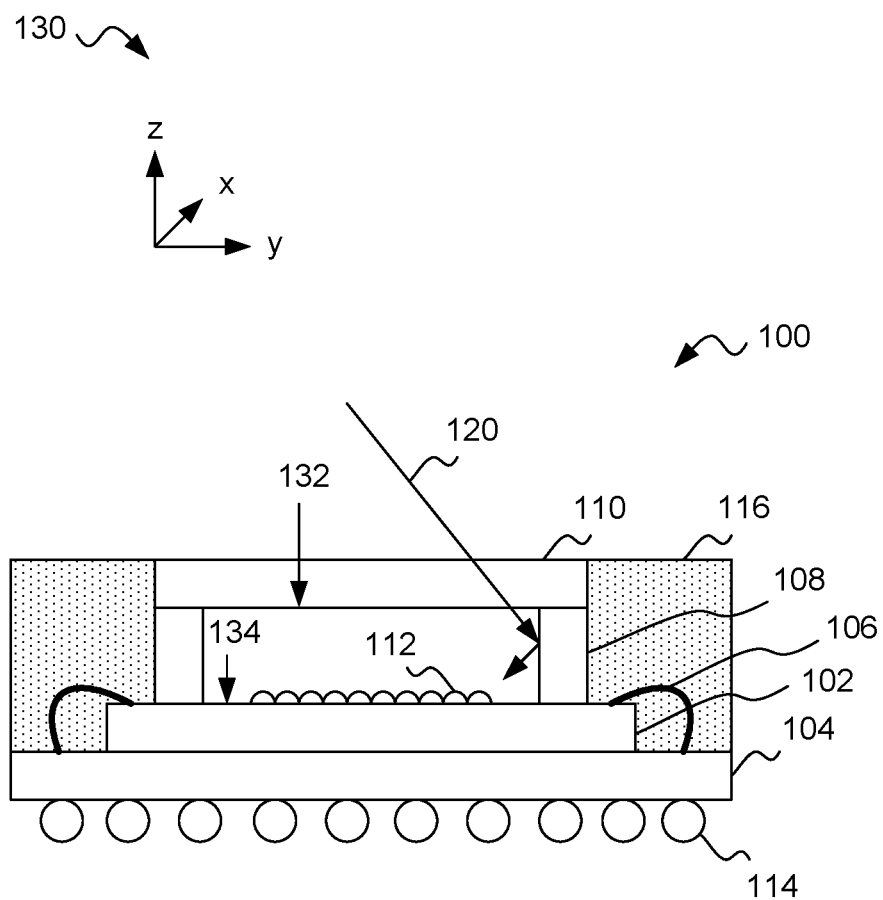
FIG. 1 illustrates an exemplary image sensor module.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

FIG. 1 illustrates an exemplary image sensor module 100. Image sensor module 100 comprises an image sensor 102 attached to a first side of a substrate 104. Image sensor 102 is wire bonded by wires 106 to pads on the first side of substrate 104. A dam 108 is disposed between image sensor 102 and a cover glass 110 enclosing or surrounding a light sensing area 112 of image sensor 102. Cover glass 110 covers light sensing area 112. A plurality of solder balls 114 are attached to a second side, which is opposite to the first side, of substrate 104 for electrically coupling image sensor 102 to outside image sensor module 100. Image sensor 102 is electrically coupled to solder balls 114 through wires 106. Optionally, an encapsulant 116 is disposed on the first side of substrate 104 to cover wires 106, substrate 104, and a part of image sensor 102 outside dam 108.

An incident light 120 transmitted through a lens (not shown) may arrive on an inner wall of dam 108, and may be reflected toward light sensing area 112 of image sensor 102 causing flare on an image detected by image sensor 102. The generated flare is not wanted and should be reduced or eliminated.

Figure 2:
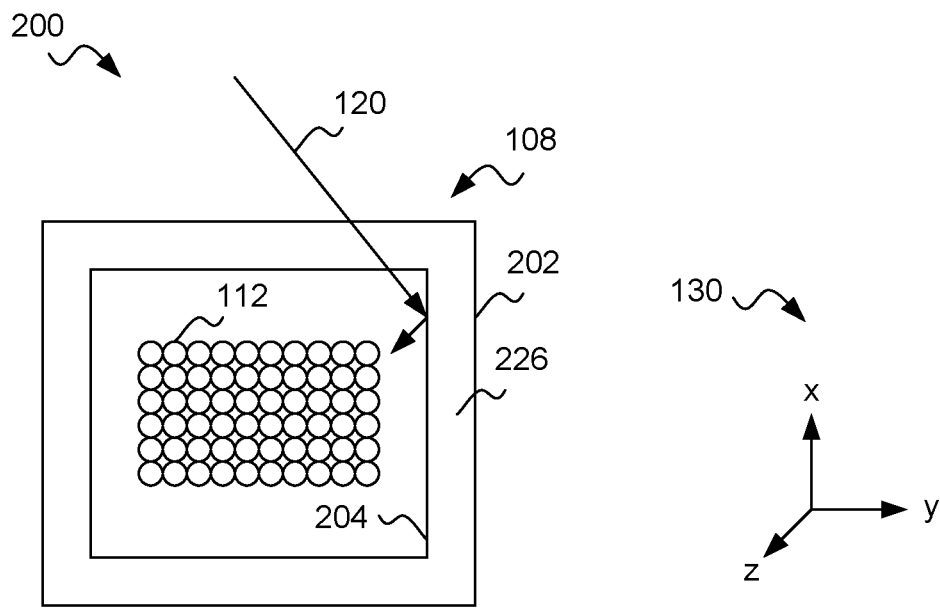
FIG. 2 illustrates an exemplary cross-section of a dam of an image sensor module in plane x-y.

A 3D coordinate system x-y-z 130 is shown in FIG. 1 for clarity. A plane of paper showing FIG. 1 is a plane of z-y, which may be considered as a vertical plane. FIG. 2 is shown on a plane of paper, which is a plane of x-y. Plane x-y may be considered as a horizontal plane. 3D coordinate system x-y-z 130 is also shown in FIGS. 2-6 in appropriate orientations. FIG. 1 shows a surface 132 of cover glass 110 and a surface 134 of light sensing area 112 of image sensor 102, which are parallel to plane x-y or the horizontal plane and orthogonal to plane z-y or the vertical plane.

FIG. 2 illustrates an exemplary cross-section 200 of dam 108 in plane x-y. Cross-section 200 is parallel to the horizontal plane or surface 132 of cover glass 110 and surface 134 of light sensing area 112 of image sensor 102 (see FIG. 1). Dam 108 has an outer wall 202 and an inner wall 204. Incident light 120 may arrive at inner wall 204 of dam 108. Note that FIG. 2 shows a projection of incident light 120 on plane x-y. The real incident light 120 does not pass through a wall 226 of dam 108. Incident light 120 may be reflected by inner wall 204 toward light sensing area 112 causing flare on a detected image.

Figure 3:
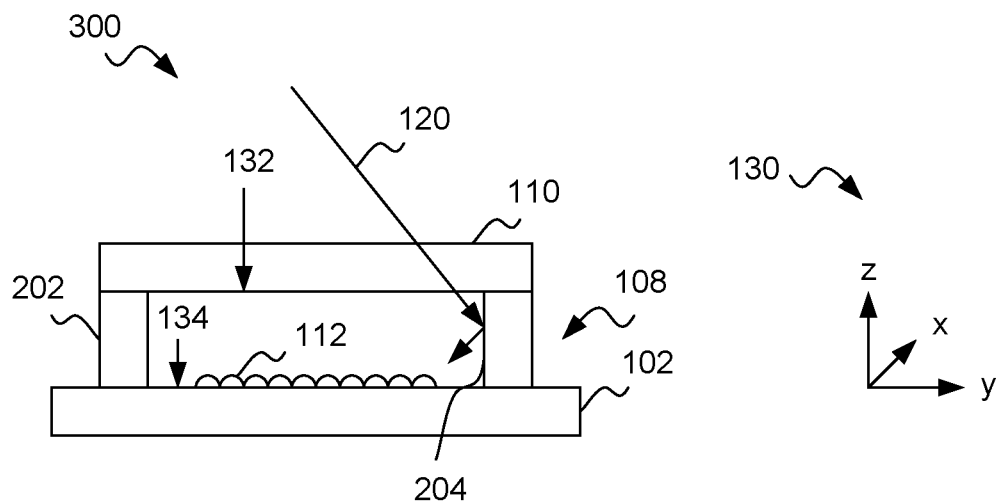
FIG. 3 illustrates an exemplary cross-section of a dam of an image sensor module in plane z-y.

FIG. 3 illustrates an exemplary cross-section 300 of dam 108 in plane z-y, which is similar to FIG. 1. Cross-section 300 is parallel to the vertical plane or orthogonal to surface 132 of cover glass 110 and surface 134 of light sensing area 112 of image sensor 102. Dam 108 has outer wall 202 and inner wall 204. Dam 108 is between image sensor 102 and cover glass 110. Incident light 120 may arrive at inner wall 204 of dam 108. Incident light 120 may be reflected by inner wall 204 toward light sensing area 112 of image sensor 102 causing flare on an image detected by image sensor 102.

Figure 4:
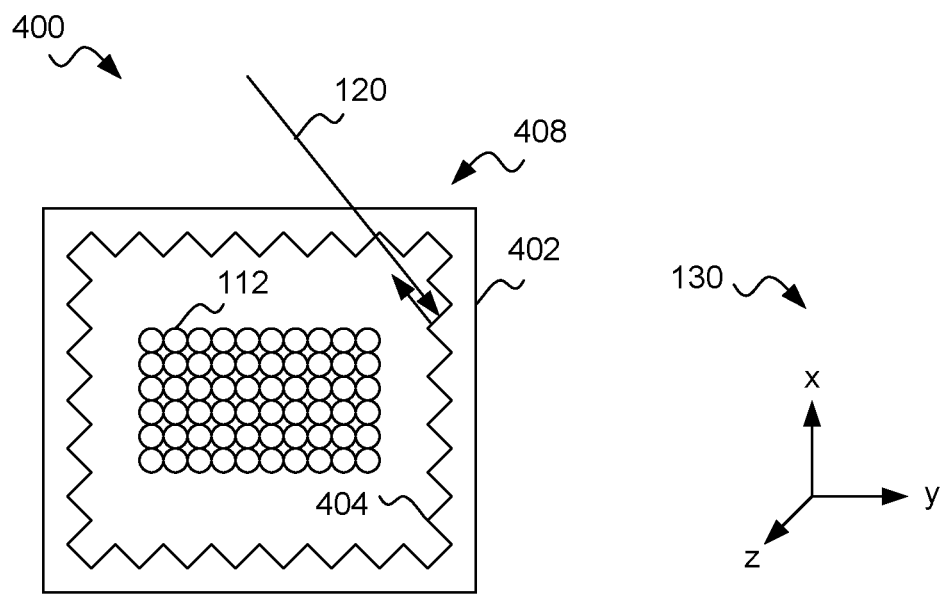
FIG. 4 illustrates an exemplary cross-section of a dam of an image sensor module in plane x-y, according to an embodiment of the present invention.

FIG. 4 illustrates an exemplary cross-section 400 of dam 408 in plane x-y, according to an embodiment of the present invention. Cross-section 400 is parallel to the horizontal plane or surface 132 of cover glass 110 and surface 134 of light sensing area 112 of image sensor 102 (see FIG. 1). Dam 408 has an outer wall 402 and an inner wall 404. Cross-section 400 of inner wall 404 forms a sawtooth pattern. The sawtooth pattern of inner wall 404 may be shown in FIG. 4, and may be other sawtooth patterns. When incident light 120 arrives at inner wall 404, inner wall 404 having sawtooth pattern may not reflect incident light 120 toward light sensing area 112, and thus not causing flare on a detected image. Inner wall 404 having sawtooth pattern reduces or eliminates the reflected incident light toward light sensing area 112. Dam 408 may or may not completely enclose light sensing area 112.

Figure 5:
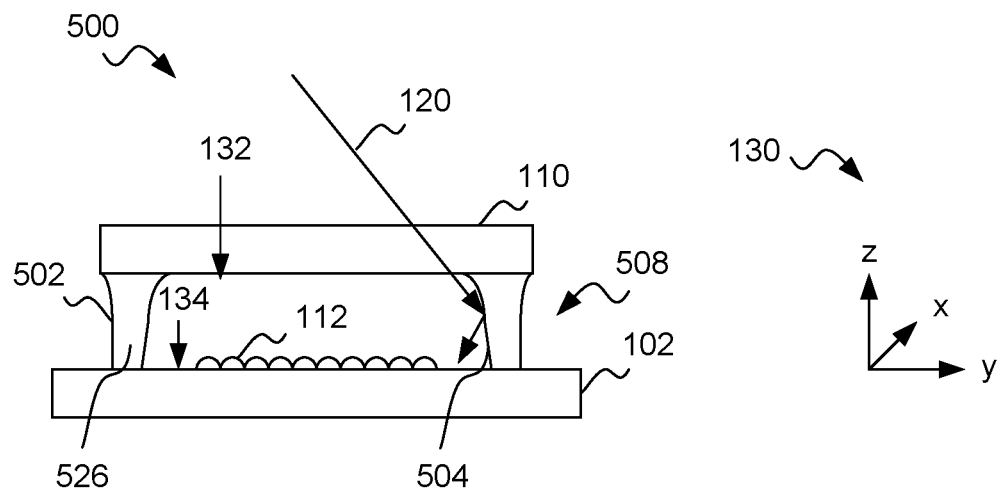
FIG. 5 illustrates an exemplary cross-section of a dam of an image sensor module in plane z-y, according to an embodiment of the present invention.

FIG. 5 illustrates an exemplary cross-section 500 of dam 508 in plane z-y, according to an embodiment of the present invention. Cross-section 500 is parallel to the vertical plane or orthogonal to surface 132 of cover glass 110 and surface 134 of light sensing area 112 of image sensor 102. Dam 508 has an outer wall 502 and an inner wall 504. Cross-section 500 of a wall 526 of dam 508 has a wider part next to cover glass 110 and narrower part next to image sensor 102. Thus, outer wall 502 and inner wall 504 have inclined and/or curved surfaces. Cross-section 500 of inner wall 504 forms an inclined surface. Dam 508 is between image sensor 102 and cover glass 110. When incident light 120 arrives at inner wall 504, inner wall 504 having an inclined and/or curved surface may not reflect incident light 120 toward light sensing area 112 of image sensor 102, and thus not causing flare on an image detected by image sensor 102. Inner wall 504 having inclined and/or curved surface reduces or eliminates the reflected incident light toward the light sensing area of image sensor 102.

Inner wall 504 may have an inclined surface as seen from cross-section 500 in plane z-y or vertical plane orthogonal to surface 132 of cover glass 110 and surface 134 of light sensing area 112 of image sensor 102 as shown in FIG. 5, and also a sawtooth pattern as shown in FIG. 4, as seen from cross-section 400 in plane x-y or horizontal plane parallel to surface 132 of cover glass 110 and surface 134 of light sensing area 112 of image sensor 102 (see FIG. 1).

Figure 6:
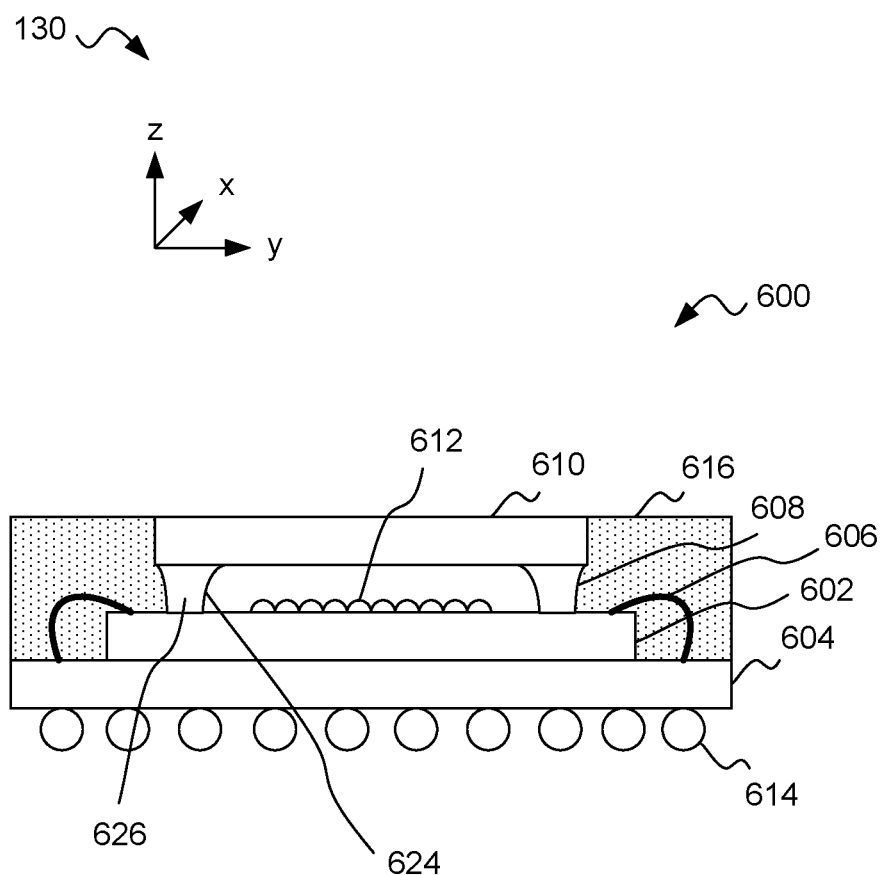
FIG. 6 illustrates an exemplary image sensor module, according to an embodiment of the present invention.

FIG. 6 illustrates an exemplary image sensor module 600, according to an embodiment of the present invention. Image sensor module 600 comprises an image sensor 602 attached to a first side of a substrate 604. Image sensor 602 is wire bonded by wires 606 to pads on the first side of substrate 604. A dam 608 is disposed between image sensor 602 and a cover glass 610 enclosing or surrounding a light sensing area 612 of image sensor 602. For example, dam 608 is immediately between image sensor 602 and cover glass 610. Cover glass 610 covers light sensing area 612. A plurality of solder balls 614 are attached to a second side, which is opposite to the first side, of substrate 604 for electrically coupling image sensor 602 to outside image sensor module 600. Image sensor 602 is electrically coupled to solder balls 612 through wires 606. Optionally, an encapsulant 616 is disposed on the first side of substrate 604 to cover wires 606, substrate 604, and a part of image sensor 602 outside dam 608. For example, encapsulant 616 is black.

Dam 608 may be dam 408 of FIG. 4. An inner wall 624 is similar to inner wall 404 of FIG. 4 having a sawtooth pattern to reduce or eliminate the reflected incident light (not shown) toward light sensing area 612 of image sensor 602. Furthermore, inner wall 624 may also have an inclined and/or curved surface as inner wall 504 shown in FIG. 5 to further reduce or eliminate the reflected incident light toward light sensing area 612 of image sensor 602. Thus dam 608 may be dam 508 of FIG. 5, having a wall 626 similar to wall 526 of FIG. 5. A cross-section of wall 626 of dam 608 in plane z-y has a wider part next to cover glass 610 and a narrower part next to image sensor 602. Yet, to further reduce or eliminate the reflected incident light toward light sensing area 612 of image sensor 602, a thickness of dam 608 is less than 40 μm.

Figure 7A:
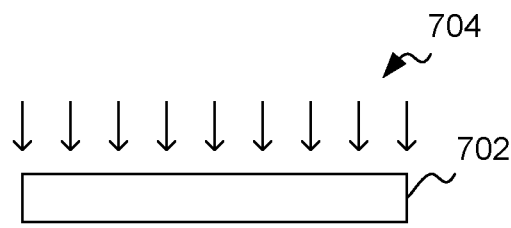
FIG. 7A illustrates a first step of a method for making a dam of an image sensor module, a cover glass is provide and optionally cleaned by plasma, according to an embodiment of the present invention.
Figure 7B:
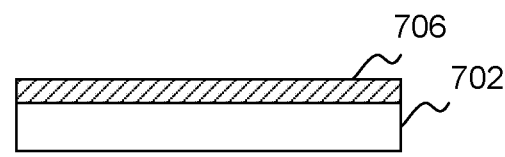
FIG. 7B illustrates a second step of the method, the cover glass is laminated using a dry film, according to an embodiment of the present invention.
Figure 7C:
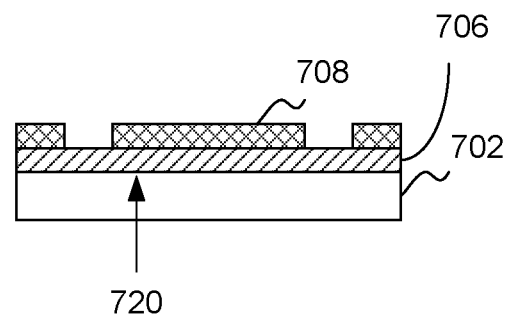
FIG. 7C illustrates a third step of the method, an exposure mask is aligned to cover the dry film, according to an embodiment of the present invention.
Figure 7D:
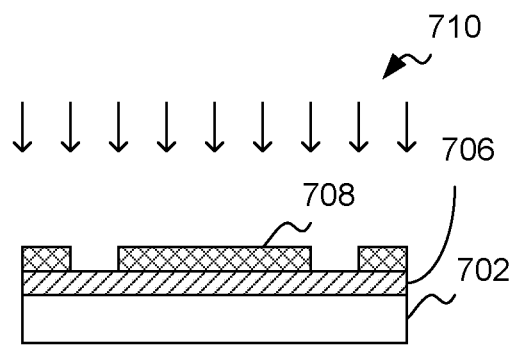
FIG. 7D illustrates a fourth step of the method, the exposure mask is exposed to exposing UV (ultra violet) light, according to an embodiment of the present invention.
Figure 7E:
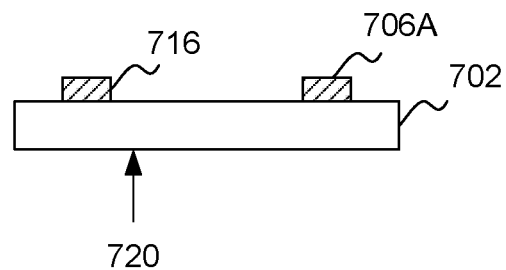
FIG. 7E illustrates the fifth step of the method, the dry film is developed in a photo lithographic process, according to an embodiment of the present invention.

FIG. 7A-7G illustrate an exemplary method for making at least a dam (e.g., dam 608), which is attached to a cover glass (e.g., cover glass 610) comprising eight primary steps, according to an embodiment of the present invention. FIG. 7A illustrates a first step, in which a cover glass 702 is provided, optionally cover glass 702 is cleaned by plasma 704. Cover glass 702 may be a glass wafer. FIG. 7B illustrates a second step, in which cover glass 702 is laminated using a dry film 706. Dry film 706 is a photo lithographic material. FIG. 7C illustrates a third step, in which an exposure mask 708 is aligned to cover dry film 706. Exposure mask 708 is parallel to a surface 720 of cover glass 702, FIG. 7D illustrates a fourth step, in which exposure mask 708 is exposed to exposing UV (ultra violet) light 710. After exposure mask 708 is removed, FIG. 7E illustrates the fifth step, in which dry film 706 is developed in a photo lithographic process. A pattern of dry film 706 is formed corresponding to the pattern of exposure mask 708. The formed pattern of dry film 706 comprises at least a pre-cured dam 706A. Dam 706A may be dam 408 of FIG. 4, where the inner wall of the dam has a sawtooth pattern. Dam 706A of dry film 706 is formed and a cross-section of an inner wall 716 of dam 706A, parallel to surface 720 of cover glass 702, forms a sawtooth pattern corresponding to a pattern of exposure mask 708.

Figure 7F:
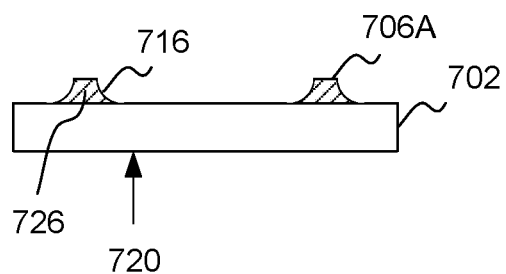
FIG. 7F illustrates a sixth step of the method, the photo-lithographically processed dry film is cured by heating, according to an embodiment of the present invention.

FIG. 7F illustrates a sixth step, in which the photolithographically processed dry film 706 including dam 706A is cured by heating. Cured dry film 706 forms at least a post-cured dam 706A attached to cover glass 702. For simplicity, pre-cured and post cured dam 706A are recognized as dam 706A. The heating causes the dry film of dam 706A to create an overflow on surface 720 of cover glass 702. Cover glass 702 is under dam 706A. After the overflow cooled off, a cross-section of a wall 726 of dam 706A, orthogonal to surface 720 of cover glass 702, has a wider part next to cover glass 702 and a narrower part away from cover glass 702 due to the overflow. Thus, a cross-section of inner wall 716 of dam 706A, orthogonal to surface 720 of cover glass 702, forms an inclined surface.

Figure 7G:
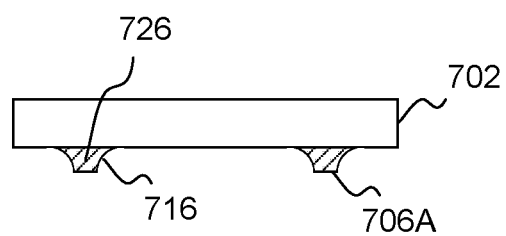
FIG. 7G illustrates a seventh step of the method, the cover glass is flipped over making a dam is under the cover glass, according to an embodiment of the present invention.
Figure 7H:
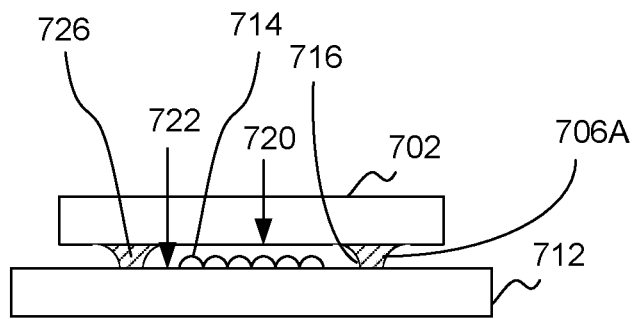
FIG. 7H illustrates a eighth step of the method, the flipped over cover glass including a dam attached to the cover glass are disposed on an image sensor, according to an embodiment of the present invention.

FIG. 7G illustrates a seventh step, in which cover glass 702 is flipped over making dam 706 is under cover glass 702. In this position, an upper part of wall 726 of dam 706A is wider than the bottom part of wall 726 of dam 706A. FIG. 7H illustrates an eighth step, in which the flipped over cover glass 702 including dam 706. A that is attached to cover glass 702 are disposed on an image sensor 712 comprising a light sensing area 714. Dam 706A surrounds light sensing area 714. A surface 722 of light sensing area 714 of image sensor 712 is parallel to surface 720 of cover glass 702. Necessary adhesive may be applied between dam 706A and image sensor 712 to mount dam 706A to image sensor 712.

Cover glass 702, dam 706A, and image sensor 712 may be cover glass 610, dam 608, and image sensor 602 of FIG. 6. Dam 706A is made of dry film 706. Cured dry film 706 forms at least a dam 706A attached to cover glass 702. Image sensor 702 may be one of at least one image sensors on a substrate wafer.

While the present invention has been described herein with respect to the exemplary embodiments and the best mode for practicing the invention, it will be apparent to one of ordinary skill in the art that many modifications, improvements and sub-combinations of the various embodiments, adaptations and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor module comprising:
    an image sensor having a light sensing area;
    a cover glass for covering the light sensing area, wherein a surface of the image sensor is parallel to a surface to the cover glass;
    a dam between the image sensor and the cover glass, surrounding the light sensing area, having an outer wall and an inner wall, wherein a cross-section of the inner wall parallel to the surface of the light sensing area of the image sensor forms a sawtooth pattern;
    wherein a space separates the dam and the light sensing area;
    wherein a top of the dam is attached to the cover glass and a bottom of the dam is attached to the image sensor; and
    wherein incident light arrives at the inner wall of the dam and the inner wall having the sawtooth pattern reduces reflected incident light toward the light sensing area.

2. The image sensor of claim 1 further comprising:
    a substrate having a first side and a second side;
    wherein:
    the second side is opposite to the first side;
    the image sensor is disposed on the first side of the substrate;
    the image sensor is wire bonded by wires to pads on the first side of the substrate;
    a plurality of solder balls are attached to the second side of the substrate.

3. The image sensor of claim 2 further comprising:
    an encapsulant disposed on the first side of the substrate covering the wires, the substrate, and a part of the image sensor outside the dam.

4. The image sensor of claim 3, wherein the encapsulant is black.

5. The image sensor module of claim 1, wherein a cross-section of the inner wall of the dam between the image sensor and the cover glass orthogonal to the surface of the light sensing area of the image sensor forms an inclined surface.

6. The image sensor module of claim 1, wherein a cross-section of a wall of the dam between the image sensor and the cover glass orthogonal to the surface of the light sensing area of the image sensor has a wider part next to the cover glass and a narrower part next to the image sensor.

7. The image sensor of claim 1, wherein a thickness between the cover glass and the image sensor of the dam is less than 40 μm.

8. The image sensor of claim 1, wherein the dam is made of a dry film attached to the cover glass.

9. The image sensor of claim 8, wherein the dry film is a photo lithographic material.

\* \* \* \* \*

EX PARTE REEXAMINATION CERTIFICATE (12575th)
United States Patent
Lin et al.

(10) Number: US 11,515,347 C1
(45) Certificate Issued: Apr. 15, 2024

(54) DAM OF IMAGE SENSOR MODULE HAVING SAWTOOTH PATTERN AND INCLINED SURFACE ON ITS INNER WALL AND METHOD OF MAKING SAME

(71) Applicants: Wei-Feng Lin, Hsinchu (TW); En-Chi Li, Hsinchu (TW); Chi-Chih Huang, Taoyuan (TW)

(72) Inventors: Wei-Feng Lin, Hsinchu (TW); En-Chi Li, Hsinchu (TW); Chi-Chih Huang, Taoyuan (TW)

(73) Assignee: OMNIVISION TECHNOLOGIES, INC., Santa Clara, CA (US)

Reexamination Request:
No. 90/019,251, Sep. 13, 2023

Reexamination Certificate for:
Patent No.: 11,515,347
Issued: Nov. 29, 2022
Appl. No.: 16/747,130
Filed: Jan. 20, 2020

(51) Int. Cl.
*H01L 27/146* (2006.01)

(52) U.S. Cl.
CPC .. *H01L 27/14623* (2013.01); *H01L 27/14618* (2013.01); *H01L 27/14632* (2013.01); *H01L 27/14636* (2013.01); *H01L 27/14685* (2013.01); *H01L 27/14687* (2013.01)

(58) Field of Classification Search
None
See application file for complete search history.

(56) References Cited

To view the complete listing of prior art documents cited during the proceeding for Reexamination Control Number 90/019,251, please refer to the USPTO's Patent Electronic System.

*Primary Examiner* — Deandra M Hughes

(57) ABSTRACT

An image sensor module comprises an image sensor having a light sensing area, a cover glass for covering the light sensing area, a dam between the image sensor and the cover glass, which surrounds the light sensing area, and has an outer wall and an inner wall, where a cross-section of the inner wall parallel to the surface of the light sensing area of the image sensor forms a sawtooth pattern and/or, where a cross-section of the inner wall orthogonal to the surface of the light sensing area of the image sensor forms an inclined surface.

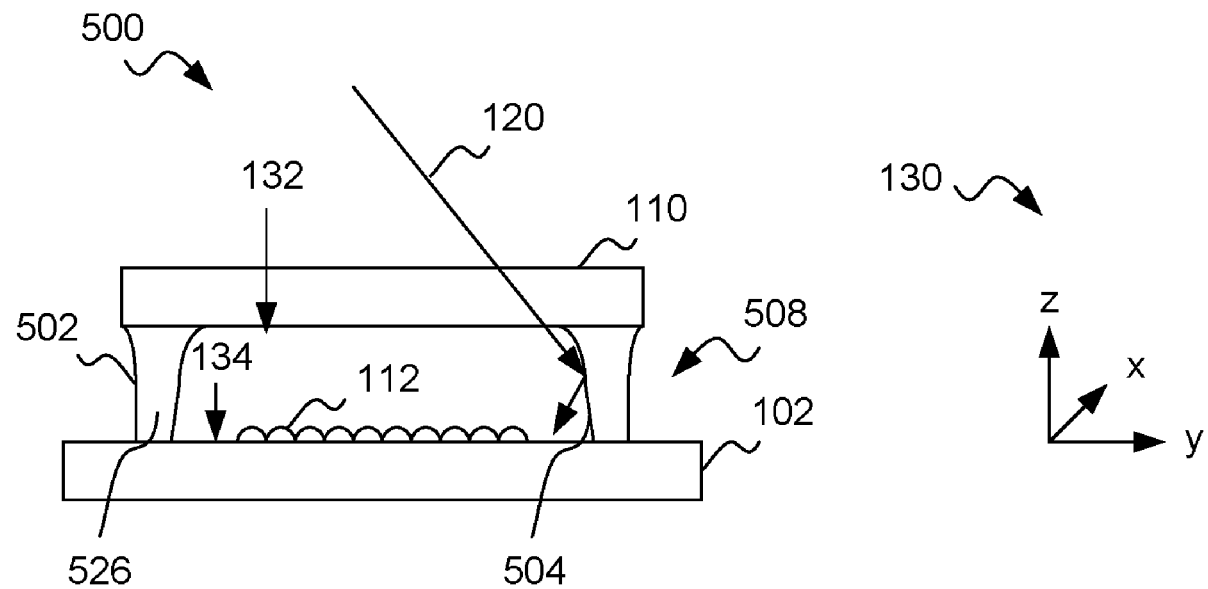

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 5-6 are cancelled.

Claims 1-4 and 7-9 are determined to be patentable as amended.

New claims 10-17 are added and determined to be patentable.

1. An image sensor module comprising:
   an image sensor having a light sensing area;
   a cover glass for covering the light sensing area, wherein a surface of the image sensor is parallel to a surface [to] *of* the cover glass;
   a dam between the image sensor and the cover glass, surrounding the light sensing area, having an outer wall and an inner wall, wherein a cross-section of the inner wall parallel to the surface of the light sensing area of the image sensor forms a sawtooth pattern;
   wherein a space separates the dam and the light sensing area;
   wherein a top of the dam is attached to the cover glass and a bottom of the dam is attached to the image sensor; [and]
   wherein incident light arrives at the inner wall of the dam and the inner wall having the sawtooth pattern reduces reflected incident light toward the light sensing area[.];
   *wherein a cross-section of the inner wall of the dam between the image sensor and the cover glass orthogonal to the surface of the light sensing area of the image sensor forms a curved surface; and*
   *wherein incident light arrives at the inner wall of the dam and the inner wall having the curved surface reflects the incident light toward side of the image sensor.*

2. The image sensor *module* of claim 1 further comprising:
   a substrate having a first side and a second side;
   wherein:
   the second side is opposite to the first side;
   the image sensor is disposed on the first side of the substrate;
   the image sensor is wire bonded by wires to pads on the first side of the substrate;
   a plurality of solder balls are attached to the second side of the substrate.

3. The image sensor *module* of claim 2 further comprising:
   an encapsulant disposed on the first side of the substrate covering the wires, the substrate, and a part of the image sensor outside the dam.

4. The image sensor *module* of claim 3, wherein the encapsulant is black.

7. The image sensor *module* of claim 1, wherein a thickness between the cover glass and the image sensor of the dam is less than 40 μm.

8. The image sensor *module* of claim 1, wherein the dam is made of a dry film attached to the cover glass.

9. The image sensor *module* of claim 8, wherein the dry film is a photo lithographic material.

10. *An image sensor module comprising:*
    *an image sensor having a light sensing area;*
    *a cover glass for covering the light sensing area, wherein a surface of the image sensor is parallel to a surface of the cover glass;*
    *a dam between the image sensor and the cover glass, surrounding the light sensing area, having an outer wall and an inner wall, wherein a cross-section of the inner wall parallel to the surface of the light sensing area of the image sensor forms a sawtooth pattern;*
    *wherein a space separates the dam and the light sensing area;*
    *wherein a top of the dam is attached to the cover glass and a bottom of the dam is attached to the image sensor; and*
    *wherein incident light arrives at the inner wall of the dam and the inner wall having the sawtooth pattern reduces reflected incident light toward the light sensing area;*
    *a substrate having a first side and a second side wherein:*
    *the second side is opposite to the first side;*
    *the image sensor is disposed on the first side of the substrate;*
    *the image sensor is wire bonded by wires to pads on the first side of the substrate;*
    *plurality of solder balls are attached to the second side of the substrate;*
    *the image sensor is electrically coupled to the solder balls through the wires;*
    *the solder balls electrically couple the image sensor to outside image sensor module.*

11. *The image sensor module of claim 10 further comprising:*
    *an encapsulant disposed on the first side of the substrate covering the wires, the substrate, and a part of the image sensor outside the dam.*

12. *The image sensor module of claim 11, wherein the encapsulant is black.*

13. *The image sensor module of claim 10, wherein a cross-section of the inner wall of the dam between the image sensor and the cover glass orthogonal to the surface of the light sensing area of the image sensor forms an inclined surface.*

14. *The image sensor module of claim 10, wherein a cross-section of a wall of the dam between the image sensor and the cover glass orthogonal to the surface of the light sensing area of the image sensor has a wider part next to the cover glass and a narrower part next to the image sensor.*

15. *The image sensor module of claim 10, wherein a thickness between the cover glass and the image sensor of the dam is less than 40 μm.*

16. *The image sensor module of claim 10, wherein the dam is made of a dry film attached to the cover glass.*

17. *The image sensor module of claim 16, wherein the dry film is a photo lithographic material.*

\* \* \* \* \*